United States Patent
Won et al.

(10) Patent No.: US 9,336,862 B2
(45) Date of Patent: May 10, 2016

(54) SENSE AMP ACTIVATION ACCORDING TO WORD LINE COMMON POINT

(71) Applicant: ORACLE INTERNATIONAL CORPORATION, Redwood Shores, CA (US)

(72) Inventors: Myung Gyoo Won, San Jose, CA (US); Heechoul Park, San Jose, CA (US); Thu Hanh Nguyen, Fremont, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/288,486

(22) Filed: May 28, 2014

(65) Prior Publication Data

US 2015/0348614 A1    Dec. 3, 2015

(51) Int. Cl.
*G11C 11/00*    (2006.01)
*G11C 11/419*   (2006.01)

(52) U.S. Cl.
CPC .................... *G11C 11/419* (2013.01)

(58) Field of Classification Search
USPC .................................. 365/154, 205
See application file for complete search history.

(56) References Cited

U.S. PATENT DOCUMENTS

| | | | | |
|---|---|---|---|---|
| 4,807,193 A | * | 2/1989 | Takemae et al. | 365/205 |
| 5,973,992 A | * | 10/1999 | Casper | 365/233.5 |
| 6,185,135 B1 | * | 2/2001 | Netis et al. | 365/194 |
| 6,525,979 B2 | * | 2/2003 | Kato | 365/210.1 |
| 2002/0118588 A1 | * | 8/2002 | Kato | 365/210 |

\* cited by examiner

*Primary Examiner* — Hoai V Ho
(74) *Attorney, Agent, or Firm* — Kraguljac Law Group, LLC (57) ABSTRACT

Systems, methods, and other embodiments associated with controlling when a sense amplifier is activated are described. In one embodiment, a device includes detection logic connected to a plurality of word lines in a memory and configured to generate a signal upon detecting one of the plurality of word lines being activated. The device includes a sense amplifier configured to read a value from a bit line associated with an activated word line of the plurality of word lines upon receiving the signal.

19 Claims, 5 Drawing Sheets

FIG. 5 ured to receive the activation signal from a
SENSE AMP ACTIVATION ACCORDING TO WORD LINE COMMON POINT

BACKGROUND

Electronic memory permits a device to store and retrieve data. One difficulty with retrieving data in an electronic memory is a delay that occurs between requesting the data and when the data is available. The delay may be caused by one or more components/steps in reading from the electronic memory. For example, in a solid state memory such as a random access memory (RAM), one source of the delay is a predefined margin of time between activating a bit line associated with a memory cell and enabling a sense amplifier to read a value from the bit line.

The predefined margin is an amount of time built into a signal path that delays activating the sense amplifier. The purpose of the predefined margin is to provide time for the bit line to achieve a voltage that can be sensed by the sense amplifier prior to the sense amplifier being activated. Without the predefined margin, the sense amplifier may activate before the bit line has reached a correct voltage, thereby causing incorrect readings by the sense amplifier. Accordingly, the predefined margin ensures that the sense amplifier is not enabled until a value provided on the bit line is ready to be read.

The predefined margin is a function of timing variation that exists in circuitry between a common connection point and the bit line. The common connection point is a location within circuitry of the memory where a signal diverges and is provided to the memory cell and is also provided to the sense amplifier. Accounting for the timing variations adds to the predefined margin as a number of components between the common connection point and the memory cell grows. Accordingly, the predefined margin can cause additional delays when retrieving data from the memory.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems, methods and other embodiments are described herein associated with controlling when a sense amplifier is activated. In one embodiment, access times to a memory are improved by changing from where in the memory an activation signal is provided to the sense amplifier. In one embodiment, the sense amplifier receives the activation signal from a common connection point on word lines (e.g., point is common to the sense amplifier and the memory cells). By configuring a memory circuit to have the common connection point proximate to memory cells, a predefined margin between activating a bit line and activating the sense amplifier can be reduced.

Figure 1:
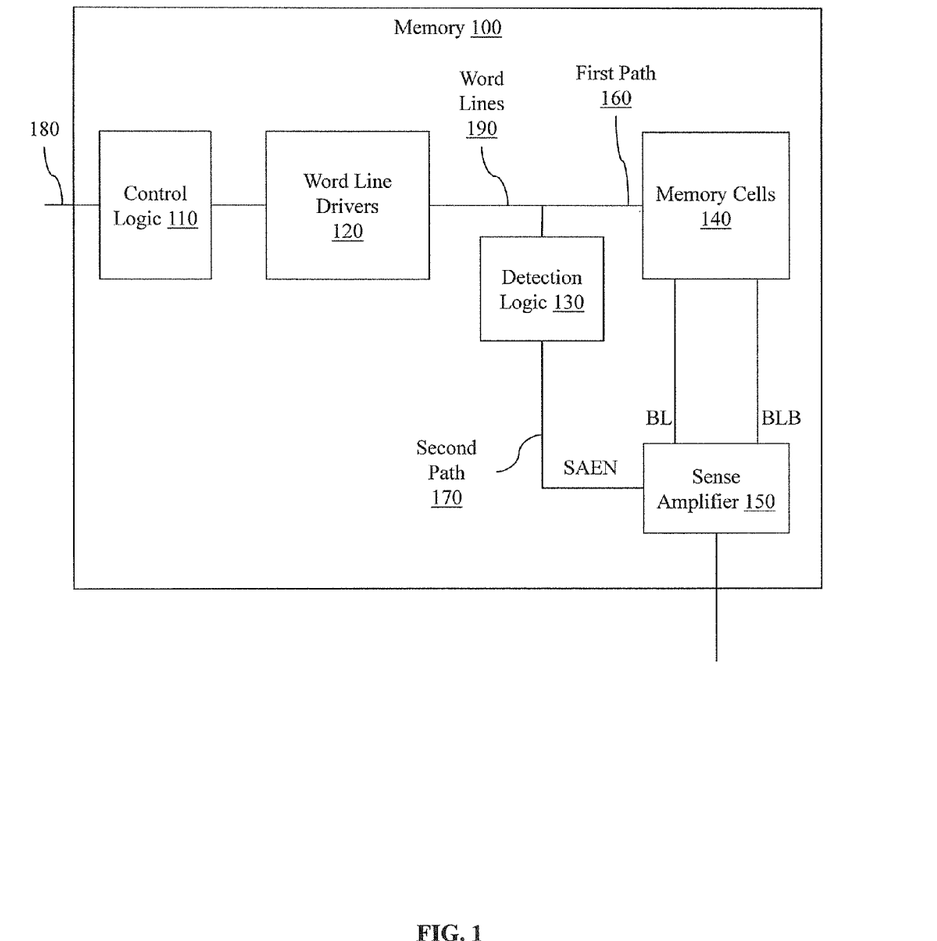
FIG. 1 illustrates one embodiment of a memory associated with controlling when a sense amplifier is activated.

With reference to FIG. 1, one embodiment of a memory 100 associated with controlling when a sense amplifier is activated is illustrated. The memory 100 includes control logic 110, word line drivers 120, detection logic 130, memory cells 140, a sense amplifier 150 and word lines 190. The memory 100 is illustrated with components 110, 120, 130, 140 and 150 for purposes of explanation, of course, the memory 100 may include additional components that are not illustrated.

Additionally, while connections between the control logic 110, the word line drivers 120, the detection logic 140 and the memory cells 140 are illustrated as being serial connections in a single line, and the word line drivers 120 are illustrated as a separate component, it should be appreciated that the word lines 190 may span from the control logic 110 to the memory cells 140 and include multiple signal lines. The word lines 120 are illustrated as a single line in FIG. 1 for purposes of simplifying this discussion.

In one embodiment, the memory circuit is configured with detection logic 130 that detects when a word line is activated and provides an activation signal to the sense amplifier 150 (e.g., a sense amplifier enable signal). The detection logic 130 implements a common connection point for the sense amplifier 150 that connects to the word lines 190 at an output of the word line drivers 120. The common connection point is placed in the memory circuit along a path of the activation signal to reduce a number of components (e.g., logic gates, etc.) between the common connection point and the memory cells 140. The detection logic 130 is configured to detect the activation of word lines 190 at a location in the word lines 190 that is proximate (i.e., just before an input) to the memory cells 140. Accordingly, the detection logic 130 is configured with connections to the word lines 190 that output signals from the word lines 190 to the sense amplifier 150 via signal path 170. Thus, the common connection points to the word lines 190 at the detection logic 130 are common to the sense amplifier 150 and the memory cells 140. In one embodiment, the common connection points are points from which an input is commonly shared between the memory cells 140 and the sense amplifier 150.

Placing the common connection point in this manner avoids additional timing variations caused by having a multiplicity of components within the circuitry that may exist along a subsequent signal path leading to the memory cells 140. For example, the detection logic 130 is connected to the word lines 190 in-between the memory cells 140 and the word line drivers 120, instead of at a more distant location on a read enable line or other point at the control logic 110. Thus, the number of components that intervene between the common connection point (i.e., from the detection logic 130) and the memory cells 140 is reduced. As a result, less timing variation exists along a circuit path between the memory cells 140 and the detection logic 130.

In one embodiment, the common connection point is implemented within the detection logic 130 as a single logic gate attached/connected to each of the word lines 190 (e.g., one gate for one word line) after the word line drivers 120

(e.g., at an output of the word line drivers 120). A logic gate is activated when an associated one of the word lines 190 transitions to an active state. Thus, the logic gate in the detection logic 130 detects the signal on the word line 190 that the logic gate is connected to. In one embodiment, each logic gate is configured to cause the signal to be "split" or routed along two separate circuit paths in the memory 100. A first path 160 is a remaining portion of the activated word line that is connected to a row of the memory cells 140. A second path 170 connects the word lines 190 to the sense amplifier 150 and provides the signal from the word lines 190 to the sense amplifier 150 when the logic gate in the detection logic 130 detects the signal on the word line. The signal paths will be discussed in more detail with reference to FIG. 3.

Thus, the first path 160 to the memory cell is shorter than if the detection logic 130 were connected from the control logic 110. Accordingly, timing variation that may be present along the first path 160 is reduced since fewer components that contribute to the timing variation are present between the detection logic 130 and the memory cells 140. Because of the reduced timing variation and the proximate common connection point, the timing delay to activate the sense amplifier 150 is less/reduced and thus the predefined margin is reduced. In this way, providing the common connection point on the word line permits the sense amplifier 150 to be activated at a time closer to when the bit line BL provides a value that can be sensed by the sense amplifier 150.

The following discussion of FIG. 1 and the memory 100 provides an example by following a path of signals through the memory 100 that are generated in response to a memory request.

A path through the memory 100 begins with the control logic 110. In one embodiment, the control logic 110 is configured with one or more inputs 180 to accept memory requests. The control logic 110 is connected to a system bus of a computing system, a processor or some other component that provides the memory requests. For purposes of this discussion, the memory requests are discussed as being requests to read from the memory cells 140. Of course, the control logic 110 may also receive requests to write to the memory cells 140.

In general, a memory request includes an address that correlates with one or more of the memory cells 140. In one embodiment, the control logic 110 provides a signal on a word line that correlates with the address from the memory request. By providing the signal on the word line, the control logic 110 activates a word line driver associated with the word line and initiates the read operation. Of course, in various embodiments, other signals may be provided by the control logic 110 that in combination with the signal on the activated word line serve to activate the memory cell. However, for purposes of this discussion, only the signal on the activated word line will be discussed.

Thus, the control logic 110 provides the signal on one of the word lines 120 in response to the memory request. In one embodiment, the word lines 190 are a plurality of rows of connecting circuitry (e.g., logic gates and wire) that correlate with different rows of the memory cells 140. In general, the word lines 190 provide signals between the control logic 110 and the memory cells 140 to activate the different rows of the memory cells 140.

Because the word line drivers 120 may include various logic gates and/or other components that have an intrinsic timing variation, each of the word line drivers 120 may have an associated timing variation. The timing variation is a difference in time for a signal to propagate through a component under different environmental conditions or through two identical components with slightly varied manufacturing characteristics. In general, a time for a signal to propagate through a series of logic gates/components may vary depending on different conditions that include both environmental conditions and manufacturing characteristics. Thus, the timing variations are accounted for when timing of signals through a circuit may affect operation. In general, timing variations are accounted for by delaying signals using timing margins that ensure signals do not arrive at components out-of-order and cause timing errors.

To avoid timing variation and building additional delays into a circuit path, the detection logic 130 is connected to the word lines 190 proximate to the memory cells 140. In one embodiment, the detection logic 130 is connected at the common connection point at a location that is at an output of (downstream from/after) a series of logic gates in the word line drivers 120. The detection logic 130 is located at the common connection point to reduce a number of components along two subsequent parallel paths 160 and 170. The two parallel paths 160 and 170 originate at the common connection point and provide the signal to different components. Timing of when the signals arrive at the different components is timing sensitive and occurs according to when the signals initially arrive at the common connection point.

As an example, suppose that the common connection point was located on a read enable line between the control logic 110 and the word line drivers 120. In such an example, the detection logic 130 would "split" the signal into the two parallel paths just after the control logic 110. Consequently, a first path would include nearly an entire section of the word line drivers 120 and components within the word line drivers 120. Thus, the example first path would include more components than are present in the first path 160 when placing the detection logic 130 as illustrated in FIG. 1. Accordingly, timing variation within the first path 160 is reduced in comparison to the example first path that begins further from the memory cells 140.

Accordingly, the detection logic 130 is placed proximate to the memory cells 140 to reduce the timing variation in the first path 160. In this way, the signal from the control logic 110 arrives at the detection logic 130 after having already propagated along the activated word line. Thus, accounting for timing variation in the circuitry of the word lines 120 can be avoided.

In one embodiment, the detection logic 130 is configured to generate a signal upon detecting that one of the word lines 190 is activated by a signal from the control logic 110. For example, when the signal provided by the control logic 110 propagates to the detection logic 130, the detection logic 130 generates a sense amplifier enable (SAEN) signal from the detected signal. Accordingly, the detection logic 130 effectively "splits" the signal along two separate paths. The first path 160 is the word line connecting to the memory cell. The second path 170 connects to the sense amplifier 150 to provide the SAEN signal.

When the signal propagates past the detection logic 130 along the first path 160, one of the memory cells 140 associated with the activated word line receives the signal. When activated, a memory cell provides a stored value on a bit line (BL) and/or bit line bar (BLB) signal path. However, the activated memory cell does not instantaneously provide the values. Rather, the bit line changes to the value over a period of time. Thus, the value is not represented on the bit line until the bit line reaches a threshold value that can be read by the sense amplifier 150.

Accordingly, if the sense amplifier 150 is activated by the sense amp enable (SAEN) signal prior to the bit line reaching the threshold value, then the sense amplifier 150 will not correctly read the value from the bit line. Consequently, the second path 170 is configured with one or more components (e.g., logic gates) that delay the signal. In this way, the sense amplifier 150 is not activated until after a predefined margin of time from when the bit line should provide the value at the threshold voltage.

In general, the predefined margin is an amount of time for delaying the SAEN signal that ensures the bit line has reached the threshold value prior to the sense amplifier 150 being enabled. Because the first path 160 includes only a few components, an amount of timing variation that is accounted for is improved. Thus, the predefined margin can be reduced and the sense amplifier 150 can be controlled to activate at a time that is proximate to when the memory value is available on the bit line (BL).

Figure 2:
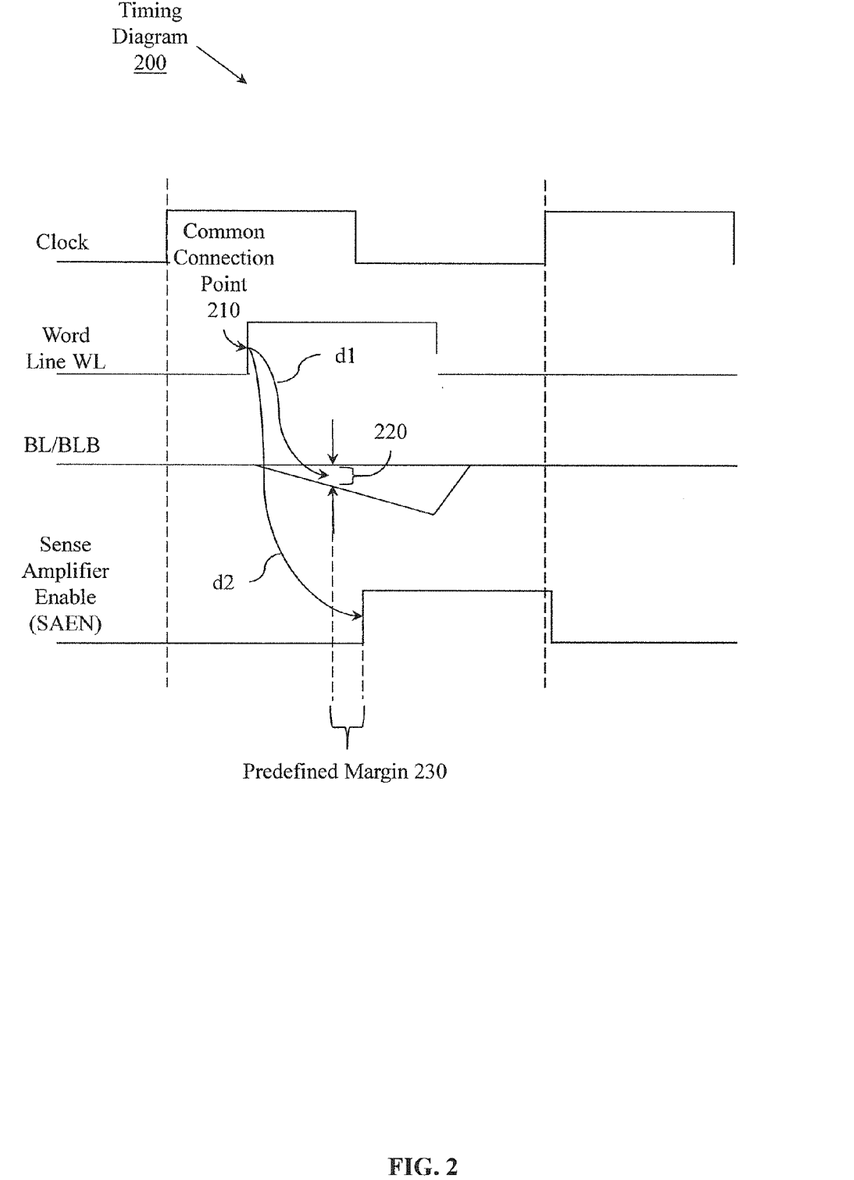
FIG. 2 illustrates one embodiment of a timing diagram associated with the memory of FIG. 1.

With reference to FIG. 2, one example of a timing diagram 200 for the memory 100 of FIG. 1 is illustrated. The timing diagram 200 illustrates a clock signal, a word line (WL) signal at a common connection point 210, a bit line/bit line bar (BL/BLB) signal and a sense enable (SAEN) signal. The clock signal is a signal that provides timing for the memory 100 and controls, for example, the control logic 110 to issue new commands. The word line signal illustrates behavior of a selected word line when reading from a memory cell associated with the word line.

Accordingly, as a signal is provided on the word line and the word line transitions to an active state at the common connection point 210, the signal is then propagated along the first path 160 (e.g., BL/BLB) and the second path 170 (SAEN) as illustrated. Thus, the bit line signal BL illustrates how the bit line transitions from being inactive to active along a ramp. That is, the value from the memory cell is not immediately available on the bit line. Instead, the value isn't available until valid point 220 where the bit line signal exceeds the threshold value.

However, because of timing delays built into the second path 170, the sense enable signal (SAEN) does not activate the sense amplifier 150 until a predefined margin 230 after the valid point 220 where the value of the bit line is finally valid. In general, the predefined margin is 15% or more than a time from the common point 210 to the point 220 where the bit line provides a valid value. Consider equation 1.

$$\frac{d2-d1}{d2+d1} * 100 > 15\% \qquad \text{Equation (1)}$$

Equation 1 represents how delay is configured into the second path 170 and thus how the predefined margin is determined. In equation 1, d2 represents a time for a signal to propagate from the common point 210 to activate the sense amplifier 150. d1 represents a time between the common point 210 and the valid point 220 of the value on the bit line. In general, a value of d2 is determined so that equation 1 is greater than 15%.

For example, a time for a signal to propagate through the first path 160 and for the bit line to achieve the valid point 220 is known and is used as the value of d1. The value of d2 is selected to satisfy equation 1. Thus, as the value of d1 increases the value of d2 and thus the predefined margin 230 also increases in order to satisfy equation 1.

Suppose that d1=20 picoseconds (ps). In this example, d2 would need to be 27 ps to satisfy equation 1.

$$\frac{27-20}{27+20} * 100 > 15\%$$

Furthermore, the predefined margin 230 is 7 ps in this example. Accordingly, the previous example illustrates timing similar to that of the memory 100 and as illustrated in FIG. 2.

By contrast, now suppose that the common point 210 is at the leading edge of the clock signal. That is, a point at which the signal from the control logic 110 of FIG. 1 diverges into the two parallel paths is connected to the clock signal instead of the word line. Thus, the common connection point in this example may be connected at the control logic 110 before the word line drivers 120. Suppose that for this example d1=120 ps.

$$\frac{162-120}{162+120} * 100 > 15\%$$

Accordingly, d2 would be at least 162 ps to satisfy the equation. The predefined margin 230 in this example would be 42 ps, which is six times that of the previous example. Thus, in comparison to the common connection point 220 of FIG. 2, the predefined margin is larger to account for additional timing variation from additional components within the path of the signal.

Figure 3:
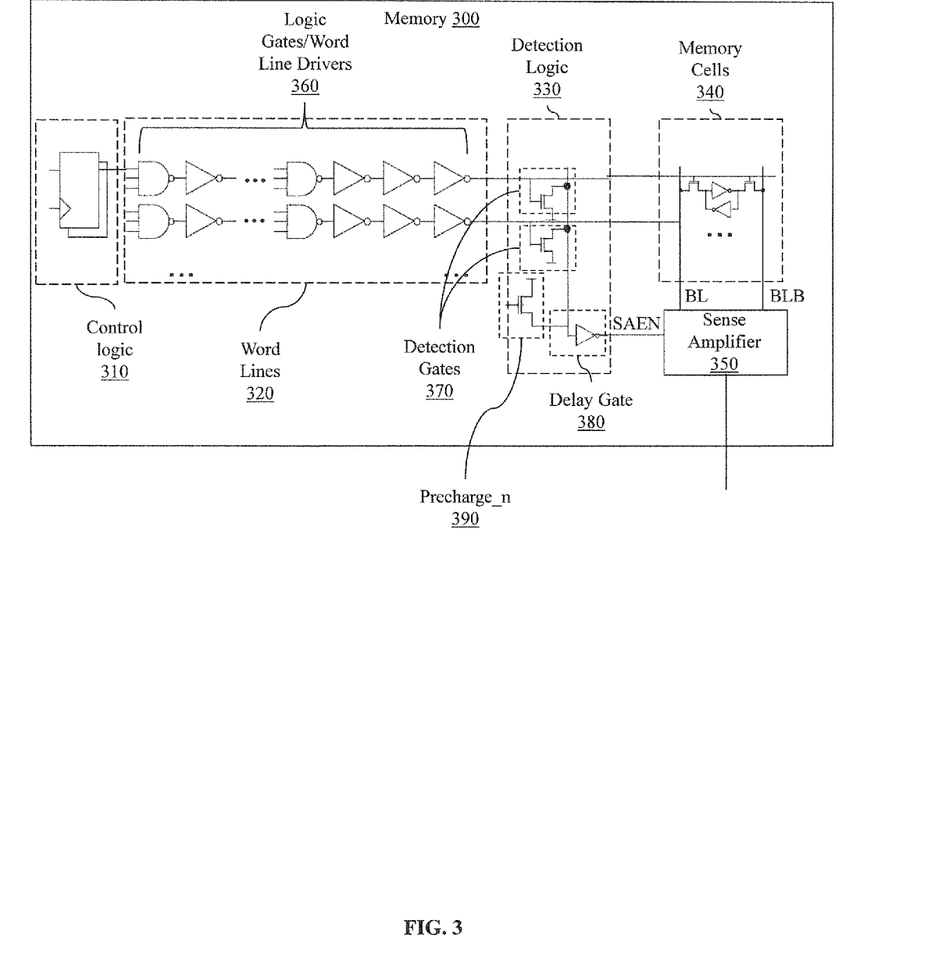
FIG. 3 illustrates another embodiment of a memory associated with controlling a sense amplifier to activate according to a signal from a word line.

With reference to FIG. 3, further aspects of configuring a memory to improve the predefined margin will be discussed along with a memory 300. The memory 300 includes components similar to those of the memory 100 of FIG. 1. For example, the memory 300 includes a control logic 310, word lines 320, detection logic 330, memory cells 340 and a sense amplifier 350. In one embodiment, the memory 300 is a static random access memory (SRAM) or other memory that is configured with a sense amplifier 350. The memory 300 is illustrated with additional details, such as logic gates that are word line drivers 360, detection gates 370 and a delay gate 380. The memory 300 may also include a precharge_n gate 390. Additionally, as used in FIG. 3, a series of three dots indicate an abbreviation of components. That is, additional components may be present but have not been illustrated for purposes of brevity.

The word line drivers 360 illustrate a general configuration of components within individual word lines of the word lines 320. The word line drivers 360 illustrate how moving the common connection point and the detection logic 330 causes a greater number of components to intervene between the common connection point and the memory cells 340 thereby adding to timing variation when accounting for the predefined margin. That is, the detection logic 330 is connected at an output of the word line drivers 360 and commonly provides signals to inputs of both the memory cells 340 and the sense amplifier 350.

Additionally, the detection logic 330 is illustrated with the detection gates 370 and the delay gate 380. In one embodiment, the detection logic 330 includes a logic gate connected to each of the word lines 320 (e.g., a one-to-one relationship) to detect when one of the word lines 320 transitions to an active state. When one of the detection gates 370 detects a transition, a signal is generated and provided to the sense amplifier 350. However, before reaching the sense amplifier 350, the signal from the detection gates 370 is delayed by passing through the delay gate 380. In this way, the detection logic 330 is configured to delay the signal for activating the sense amplifier 350 and to ensure the predefined margin is maintained. Additionally, because the detection logic 330 is proximate to the memory cells 340, the detection logic 330 includes only the single delay gate 380 instead of a plurality of delay gates that would be necessary if the detection logic was connected at, for example, the control logic 310. In one embodiment, the precharge_n gate 390 is a PMOS gate that will precharge lines to VDD before and after word line activation. The precharge_n gate 390 may be shared with a precharge signal for bit line (BL).

Figure 4:
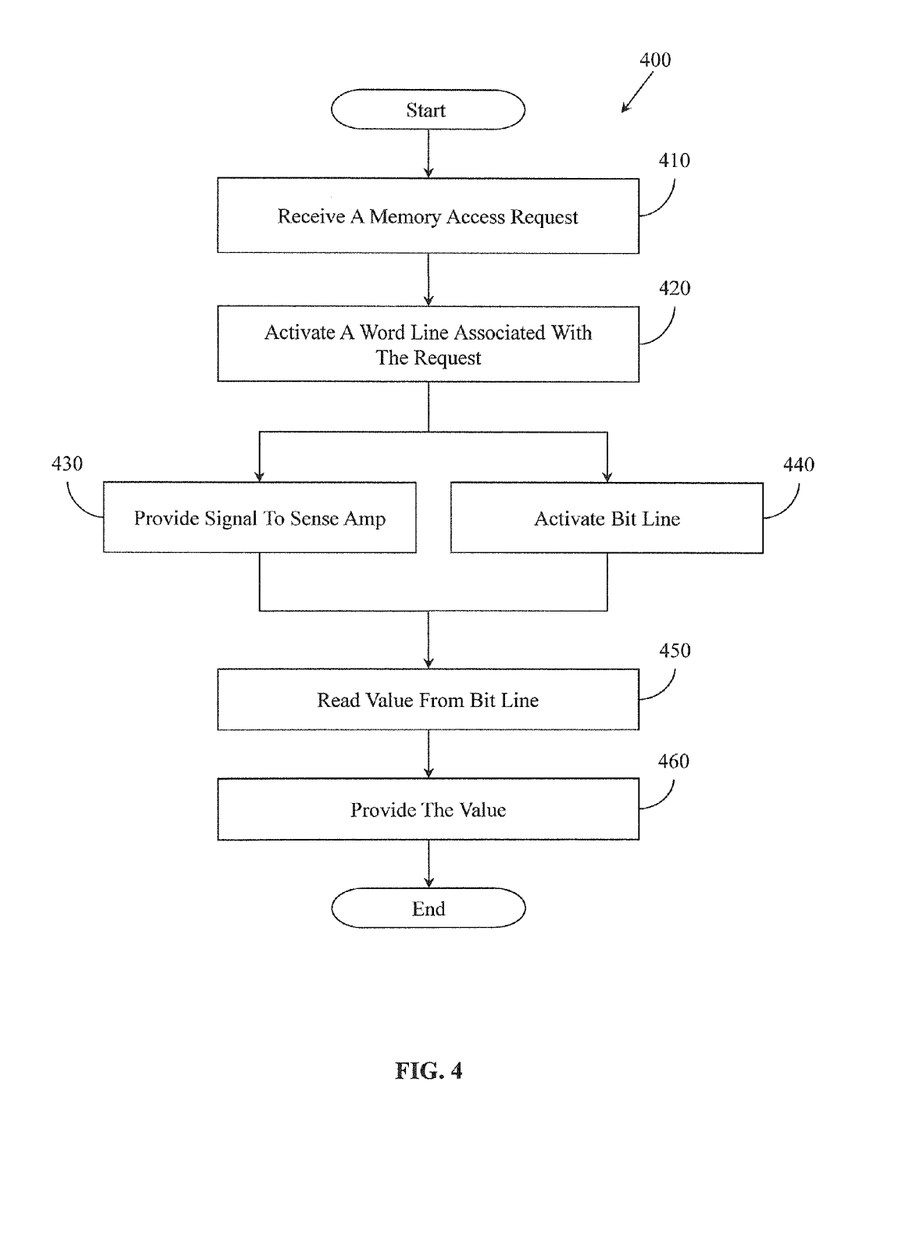
FIG. 4 illustrates an embodiment of a method associated with improving access times to a memory.

Additional aspects of improving memory access times will be discussed with reference to FIG. 4 and method 400. Method 400 will be discussed from the perspective of the memory 100 of FIG. 1.

In one embodiment, method 400 begins, at 410, when a memory request is received. In one embodiment, the control logic 110 receives the memory request and determines an address specified by the memory request. The memory request may be comprised of several different signals that are received by the control logic 110. For example, the memory request may include a read enable signal to specify that the request is to read from memory and not write to the memory. Additionally, the memory request includes one or more signals that specify an address of a memory location (e.g., memory cell) that is to be read from. Part of the address may specify a word line associated with the memory location.

Accordingly, at 420, a word line associated with the memory request is activated. In one embodiment, an activation signal is provided on the corresponding word line. That is, to activate the word line the control logic 110 sends a signal along the word line. The word line is one of a plurality of word lines. Each of the plurality of word lines are associated with, for example, a row of memory cells. Accordingly, the signal propagates down the word line via various components (e.g., logic gates) that makeup the word line.

Once the signal reaches a common connection point on the word line, the signal is provided in two separate directions in the memory circuit. That is, the signal from the word line is split from a common connection point (e.g., the detection logic 130) (see method blocks 430 and 440). The common connection point connects the signal from the word line to the sense amplifier 150 (block 430) and to the memory cells 140 for activating a bit line (block 440).

In one embodiment, the common connection point is a logic gate that is connected to the word line. When the word line transitions from an inactive state to an active state at the logic gate, the logic gate is activated and provides the signal to the sense amplifier. Furthermore, while the logic gate provides the signal to the sense amplifier, the signal also continues along the word line to a memory cell.

Accordingly, at 440, a bit line associated with the memory cell is activated simultaneously with the signal being provided to the sense amplifier at 430. While 430 and 440 are discussed as occurring simultaneously, of course, slight delays between the bit line being activated and the sense amplifier being activated are present. As discussed previously with FIG. 2, the delay is the predefined margin 230 that ensures the bit line has achieved a correct voltage before the sense amplifier is activated.

At 450, when the sense amplifier is active, a value is read from the bit line. Subsequently, at 460, the value is provided in response to the memory request.

Figure 5:
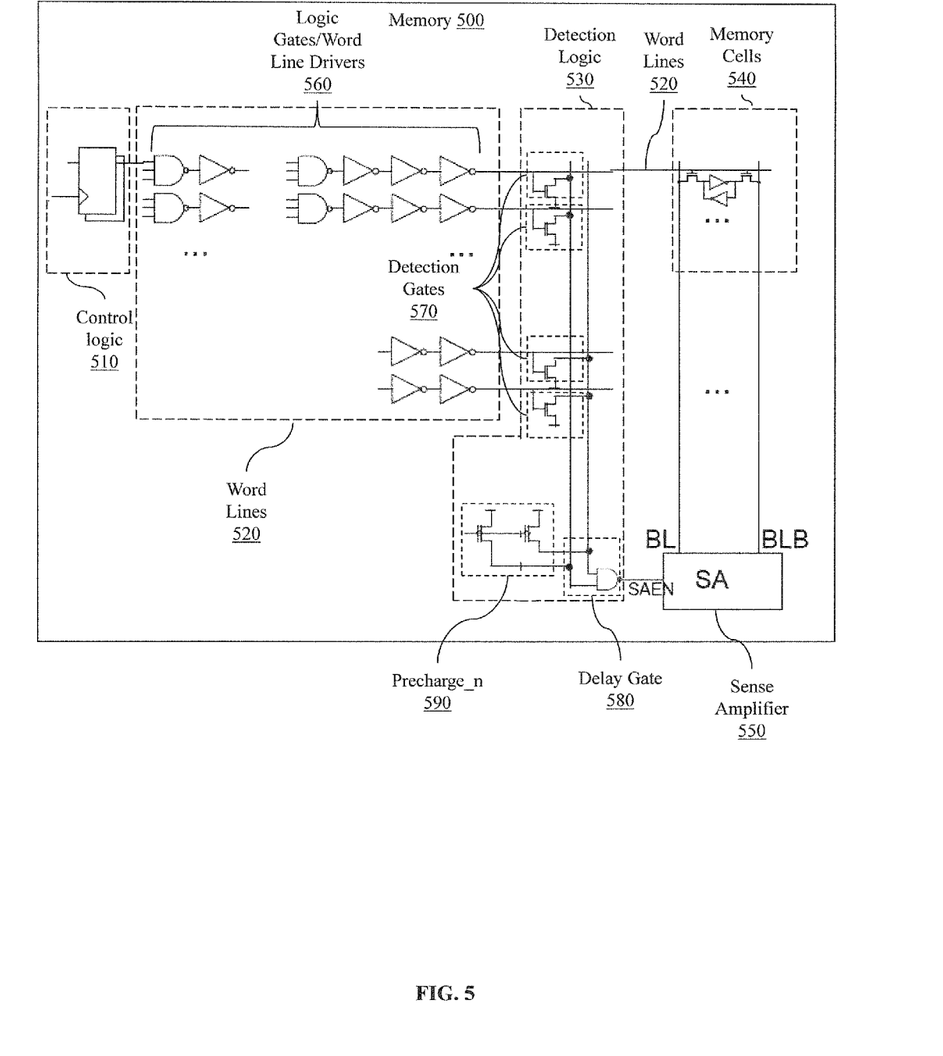
FIG. 5 illustrates another embodiment of a memory associated with controlling a sense amplifier to activate according to a signal from a word line.

With reference to FIG. 5, further aspects of configuring a memory to improve the predefined margin will be discussed along with a memory 500. The memory 500 includes components similar to those of the memory 300 of FIG. 3. For example, the memory 500 includes a control logic 510, word lines 520, detection logic 530, memory cells 540 and a sense amplifier 550. In one embodiment, the memory 500 is a static random access memory (SRAM) or other memory that is configured with a sense amplifier 550. The memory 500 is illustrated with additional details, such as logic gates that are word line drivers 560, detection gates 570 and a delay gate 580. In one embodiment, the delay gate 580 is a NAND gate. The memory 500 may also include precharge_n gates 590. Additionally, as used in FIG. 5, a series of three dots indicate an abbreviation of components. That is, additional components may be present but have not been illustrated for purposes of brevity.

The word line drivers 560 illustrate a general configuration of components within individual word lines of the word lines 520. The word line drivers 560 illustrate how moving the common connection point and the detection logic 530 causes a greater number of components to intervene between the common connection point and the memory cells 540 thereby adding to timing variation when accounting for the predefined margin.

Additionally, the detection logic 530 is illustrated with the detection gates 570 and the delay gate 580. In one embodiment, the detection logic 530 includes a logic gate connected to each of the word lines 520 (e.g., a one-to-one relationship) to detect when one of the word lines 520 transitions to an active state. When one of the detection gates 570 detects a transition, a signal is generated and provided to the sense amplifier 550. However, before reaching the sense amplifier 550, the signal from the detection gates 570 is delayed by passing through the delay gate 580. In this way, the detection logic 530 is configured to delay the signal for activating the sense amplifier 550 and to ensure the predefined margin is maintained. Additionally, because the detection logic 530 is proximate to the memory cells 540, the detection logic 530 includes only the single delay gate 580 instead of a plurality of delay gates that would be necessary if the detection logic was connected at, for example, the control logic 510. In one embodiment, the precharge_n gates 590 are PMOS gates that will precharge lines to VDD before and after word line activation. The precharge_n gates 590 may be shared with a precharge signal for bit line (BL).

In another embodiment, the described methods and/or their equivalents may be implemented with computer executable instructions. Thus, in one embodiment, a non-transitory computer storage medium is configured with stored computer executable instructions that when executed by a machine (e.g., processor, computer, and so on) cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
RAM: random access memory.
DRAM: dynamic RAM.
SRAM: synchronous RAM.
PROM: programmable ROM.
EPROM: erasable PROM.
EEPROM: electrically erasable PROM.

"Computer storage medium", as used herein, is a non-transitory medium that stores instructions and/or data. A computer storage medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer storage media may include, but are not limited to, a floppy disk, a flexible disk, a hard disk, a magnetic tape, other magnetic medium, an ASIC, a CD, other optical medium, a RAM, a ROM, a memory chip or card, a memory stick, and other electronic media that can store computer instructions and/or data. Computer storage media described herein are limited to statutory subject matter under 35 U.S.C §101.

"Logic", as used herein, includes a computer or electrical hardware component(s), firmware, a non-transitory computer storage medium that stores instructions, and/or combinations of these components configured to perform a function(s) or an action(s), and/or to cause a function or action from another logic, method, and/or system. Logic may include a microprocessor controlled by an algorithm, a discrete logic (e.g., ASIC), an analog circuit, a digital circuit, a programmed logic device, a memory device containing instructions that when executed perform an algorithm, and so on. Logic may include one or more gates, combinations of gates, or other circuit components. Where multiple logics are described, it may be possible to incorporate the multiple logics into one physical logic component. Similarly, where a single logic unit is described, it may be possible to distribute that single logic unit between multiple physical logic components. Logic as described herein is limited to statutory subject matter under 35 U.S.C §101.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A device, comprising:
   detection logic connected to a plurality of word lines in a memory and configured to generate a signal upon detecting one of the plurality of word lines being activated; and
   a sense amplifier configured to read a value from a bit line associated with an activated word line of the plurality of word lines upon receiving the signal from the detection logic,
   wherein the detection logic is configured to generate the signal from a common connection point with the plurality of word lines that reduces a margin of time between the bit line being activated and the sense amplifier being enabled.

2. The device of claim 1, wherein the bit line is activated when a memory cell associated with the bit line is activated by the activated word line, and wherein the common connection point includes at least one logic gate connected to one of the plurality of word lines.

3. The device of claim 1, wherein the common connection point is located on the plurality of word lines after a plurality of logic gates connected in series along the plurality of word lines and prior to a plurality of memory cells in the memory, wherein the detection logic is configured to use the common connection point to determine when one of the plurality of word lines transitions to an active state, and to generate the signal when one of the plurality of word lines transitions to the active state.

4. The device of claim 1, wherein the detection logic is configured to generate the signal by detecting a transition of one of the plurality of word lines from an inactive state to an active state.

5. The device of claim 1, further comprising:
   control logic configured to receive a memory request and to activate one of the plurality of word lines associated with an address in the memory request, wherein the plurality of word lines correlate with rows of memory cells.

6. The device of claim 1, wherein the detection logic is configured to generate the signal by detecting a transition of one of the plurality of word lines at the common connection point along the plurality of word lines, wherein the common connection point is a connection on the plurality of word lines that routes a signal to the sense amplifier and to a memory cell that provides a value on the bit line.

7. The device of claim 1, wherein the device is a static random-access memory (SRAM).

8. A method, comprising:
   activating, in a memory, a word line associated with an address from a memory request; and
   providing, from a common connection point on the word line, an activation signal to (i) a memory cell and (ii) a sense amplifier based, at least in part, on the common connection point transitioning from an inactive state to an active state, wherein providing the activation signal to the memory cell activates a bit line associated with the memory cell, wherein providing the activation signal from the common connection point reduces a margin of time between activating the bit line and activating sense amplifier.

9. The method of claim 8, wherein providing the activation signal from the common connection point simultaneously provides the activation signal to the sense amplifier and the memory cell.

10. The method of claim 8, further comprising:
    receiving, prior to activating the word line, a request to access the memory that includes an address of the memory cell; and
    reading, by the sense amplifier, a value from the bit line that is stored in the memory cell upon the sense amplifier being activated in response to the activation signal from the common connection point.

11. The method of claim 8, wherein providing the activation signal to the memory cell includes activating the word line that is associated with a row of memory cells that includes the memory cell.

12. The method of claim 8, wherein providing the signal occurs upon the word line transitioning from an inactive state to an active state at the common connection point.

13. The method of claim 8, wherein providing the activation signal to the sense amplifiers activates the sense amplifier causing the sense amplifier to read a value from the bit line.

14. A memory, comprising:
    a plurality of word lines connected to a controller and connected to a plurality of memory cells;
    a detection logic connected to the plurality of word lines and configured to generate an activation signal upon detecting one of the plurality of word lines transitioning from an inactive state to an active state; and
    a sense amplifier connected to the detection logic and connected to the plurality of memory cells via a bit line, wherein a common connection point is a circuit connection from which the activation signal is provided to the sense amplifier to reduce a margin of time between activating the sense amplifier and the bit line.

15. The memory of claim 14, wherein the plurality of word lines include a plurality of logic gates connected in series, and wherein the detection logic is connected to the plurality of word lines at a location that is after the plurality of logic gates and prior to the plurality of memory cells.

16. The memory of claim 14, wherein the detection logic is configured to provide the activation signal to the sense amplifier to activate the sense amplifier, and wherein the sense amplifier is configured to read a value from the bit line in response to receiving the activation signal.

17. The memory of claim 14, wherein the detection logic is connected to the plurality of word lines at the common connection point that is a location that is after one or more logic gates.

18. The memory of claim 14, wherein the plurality of memory cells include rows of memory cells that are each connected to one of the plurality of word lines.

19. The memory of claim 14, wherein the controller is configured with inputs to receive a clock signal, a memory address and a read enable signal, and wherein the memory is a static random access memory (SRAM).

* * * * *